(12) United States Patent
Weber

(10) Patent No.: US 11,006,540 B2
(45) Date of Patent: May 11, 2021

(54) CIRCUIT BOARD FOR MECHANICALLY FASTENING A HOUSING

(71) Applicant: TRIDONIC GMBH & CO KG, Dornbirn (AT)

(72) Inventor: Wolfgang Weber, Fußach (AT)

(73) Assignee: TRIDONIC GMBH & CO KG, Dornbirn (AT)

( * ) Notice: Subject to any disclaimer, the term of this patent is extended or adjusted under 35 U.S.C. 154(b) by 457 days.

(21) Appl. No.: 15/772,237

(22) PCT Filed: Nov. 7, 2016

(86) PCT No.: PCT/EP2016/076879
§ 371 (c)(1),
(2) Date: Apr. 30, 2018

(87) PCT Pub. No.: WO2017/084906
PCT Pub. Date: May 26, 2017

(65) Prior Publication Data
US 2020/0288596 A1  Sep. 10, 2020

(30) Foreign Application Priority Data

Nov. 19, 2015 (DE) ............ 10 2015 222 874.6

(51) Int. Cl.
*H05K 5/00* (2006.01)
*H05K 7/14* (2006.01)
(Continued)

(52) U.S. Cl.
CPC .......... *H05K 7/142* (2013.01); *H05K 1/0215* (2013.01); *H05K 3/325* (2013.01); *H05K 7/1427* (2013.01);
(Continued)

(58) Field of Classification Search
USPC ..... 361/753, 760, 807, 809, 810; 174/138 E, 174/138 G
See application file for complete search history.

(56) References Cited

U.S. PATENT DOCUMENTS 5,707,244 A * 1/1998 Austin .............. H01R 4/64 24/295
5,833,480 A * 11/1998 Austin .............. H01R 4/64 439/95
(Continued)

FOREIGN PATENT DOCUMENTS

DE       9115131      3/1992
DE 10 2009 053 206    5/2011
(Continued)

OTHER PUBLICATIONS

Austria Search Report dated May 19, 2016 in co-pending Austria Application GM 397/2015.
(Continued)

*Primary Examiner* — Hung S. Bui
(74) *Attorney, Agent, or Firm* — Andrus Intellectual Property Law

(57) ABSTRACT

The invention relates to a circuit board (1), preferably for a circuit for operating a lighting means, comprising a retaining bow (2), which is arranged on a planar top side (11) of the circuit board (1) and mechanically connected to the circuit board (1); and comprising a through-bore (3), which is arranged at least partially below the retaining bow (2); wherein the through-bore (3) has at least one taper (31) and wherein a housing (5) for protecting the circuit board (1) can be mechanically fastened by means of the retaining bow (2) and the taper (31). The retaining bow (2) is arranged on the circuit board (1) by means of a solder joint (32). The invention further relates to a system for a circuit for oper- (Continued)

ating a lighting means and to a method for fastening a housing (5) to a circuit board (1).

13 Claims, 5 Drawing Sheets

(51) Int. Cl.
*H05K 1/02* (2006.01)
*H05K 3/32* (2006.01)
*H05K 9/00* (2006.01)

(52) U.S. Cl.
CPC . *H05K 9/0039* (2013.01); *H05K 2201/09063* (2013.01); *H05K 2201/09072* (2013.01); *H05K 2201/10113* (2013.01)

(56) References Cited

U.S. PATENT DOCUMENTS

| | | | |
|---|---|---|---|
| 6,038,140 A * | 3/2000 | Petri | H05K 7/142 174/138 G |
| 6,186,800 B1 | 2/2001 | Klein et al. | |
| 6,366,465 B1 * | 4/2002 | Baur | H05K 7/142 211/41.17 |
| 6,695,629 B1 | 2/2004 | Mayer | |
| 2006/0114662 A1 | 6/2006 | Liu et al. | |

FOREIGN PATENT DOCUMENTS

| | | |
|---|---|---|
| FR | 2729042 | 7/1996 |
| GB | 2474509 | 4/2011 |
| JP | 2007035933 | 2/2007 |

OTHER PUBLICATIONS

German Search Report dated Jul. 21, 2016 in priority German Application 10 2015 222 874.6.
PCT Search Report dated Feb. 13, 2017 in parent PCT Application PCT/EP2016/076879.

* cited by examiner

CIRCUIT BOARD FOR MECHANICALLY FASTENING A HOUSING

CROSS REFERENCE TO RELATED APPLICATIONS

The present application is the U.S. national stage application of International Application PCT/EP2016/076879 filed Nov. 7, 2016, which international application was published on May 26, 2017 as International Publication WO 2017/084906 A1. The International Application claims priority to German Patent Application 10 2015 222 847.6 filed Nov. 19, 2015.

FIELD OF THE INVENTION

The invention relates to a circuit board and a system composed of a circuit board and a housing, preferably for a circuit for operating a lamp, e.g. a driver circuit or ballast, or an electronic ballast (abbreviated to EVG in German (Elektronisches Vorschaltgerat)). The invention relates in particular to the optimization of a retaining connection between the housing and the circuit board.

BACKGROUND OF THE INVENTION

Circuits for operating at least one lamp, e.g. an LED or gas discharge lamp are preferably disposed on a circuit board. The circuit board is provided with a housing to protect this circuit from external effects such as dirt, mechanical disruptions, moisture or electromagnetic radiation, and to protect people and the environment from the circuit, e.g. by coming in contact with conducting parts of the circuit, or from the radiation emitted by the circuit. The housing can also accommodate other elements in addition to the circuit board.

If the housing is made of a metallic material, for example, then it must also be ensured for safety reasons that a ground of the voltage supply is connected to the housing.

A mechanical retaining connection, in particular a clamping connection between the housing and the circuit board, is normally enabled by a housing retaining element. This retaining element is inserted through a hole in the circuit board, and mechanically secured by a retaining bracket. In doing so, the retaining element of the housing is not in contact with, or sufficiently in contact with the inner wall of the hole. The retaining connection can be strongly impaired as a result, when the circuit board is subjected to a mechanical load, e.g. when testing the circuit board, or when an electrical contact is established, or when the circuit is installed in the lighting system.

Conventionally, the housing is thus only inadequately mechanically secured to the circuit board. If the mechanical retaining connection is fragile, the circuit board is insufficiently protected against external effects, and the environment is not protected from the effects of the circuit board.

Moreover, due to the insufficient physical contact between the through-hole and the retaining element of the housing, the retaining force or clamping force of the retaining element may be reduced, resulting in an additional reduction in the quality of the mechanical securing. This impaired mechanical securing can lead in particular to a reduction in the quality of the ground connection between the housing and the circuit board, and in particular may lead to disruptions or breakdowns of the lamps when the circuit is tested or used.

The object of the present invention is therefore to create a circuit board that can be reliably protected by a housing, wherein the mechanical retaining connection of the housing to the circuit board is substantially improved. In particular, an electrical connection for applying a ground between the housing and the circuit board should be reliably formed, in order to improve safety when working with the housing. The mass-produced electronic circuit for a lamp should not be more expensive, and should still to be able to be produced easily.

This problem is solved with the technical features described herein.

SUMMARY OF THE INVENTION

According to a first aspect of the invention, a circuit board is provided, preferably for a circuit for operating a lamp. The lamp preferably comprises at least one LED. The circuit board has a retaining bracket disposed on a planar surface of the circuit board and mechanically connected to the circuit board. A retaining bracket is thus provided, which is secured to the circuit board. The mechanical connection of the retaining bracket is either releasable, e.g. through soldering, screwing or clamping, or permanent, e.g. through adhesive or rivets. The retaining bracket is thus configured for retaining a housing on the circuit board, in order to protect the circuit board.

The circuit board also has a through hole that is located at least partially beneath the retaining bracket. The through hole thus extends from the upper surface of the circuit board to an opposite lower surface of the circuit board.

According to the invention, the through hole has at least one structural tapering. This tapering substantially restricts the freedom of movement of the retaining element of a housing within the through hole. The tapering ensures in particular that the retaining element comes in physical contact with the through hole. The tapering comprises a projection or constriction within the through hole, for example. This tapering partially reduces the inner diameter of the through hole.

As a result, a housing can be more effectively mechanically secured to a circuit board as a result of the retaining bracket and the tapering. Because the retaining element has no freedom of movement, or very little, the housing is tightly secured to the circuit board, and is not released when a strong load is applied to the circuit board in relation to the housing. Because the freedom of movement is strongly reduced, it is also ensured that the retaining connection will remain stable over a long period of time with the intended use (testing, wiring, etc.) of the circuit, and there is therefore no need to fear that the housing will come loose from the circuit board. As a result, a loose connection, e.g. such that it can wobble, due to the lack of a mechanical securing in the through hole, is prevented. The tapering ensures that the housing, or the retaining element of the housing, is seated tightly in the through hole, such that a load applied later to the circuit board, e.g. for testing the driver circuit, or the wiring of the circuit when the lighting system is activated, does not result in the housing coming loose from the circuit board, thus failing to protect it from electromagnetic radiation, moisture or dirt.

This restriction of the freedom of movement of the housing as a result of the tapering already has advantages when attaching the housing to the circuit board, because the movement radius of the housing is restricted. As a result, the retaining element of the housing does not become bent apart when placed on the circuit board, and this mechanical retaining connection is not loosened by a relative displacement of the circuit board within the housing.

In a preferred design, the retaining bracket is electrically connected to a ground. The tapering thus fulfills two functions, in that the housing can be secured mechanically to the circuit board, and at the same time, a reliable electrical connection is established between the housing and the circuit board.

The housings for electronic ballasts are preferably made of metal, in order to provide a mechanical protection as well as a shielding against electromagnetic radiation. The grounding of the housing is intended to produce a defined reference potential or a potential equalization, through which an incorrect voltage occurring on the housing is short circuited. According to standardized guidelines in building technology, metallic housings must be grounded.

By improving the mechanical retaining connection, the electric contact between the housing and the circuit board is also improved. A loose retaining connection results in a weak or partially interrupted electrical connection. The safety and functionality of such a circuit board are thus substantially increased. The formation of the retaining bracket as a grounding conductor makes it possible to efficiently produce a circuit for operating lamps, because the double function is reliably produced with a single connection. In particular, by providing a tapering in the through hole, it is ensured that the grounding conductor is always in contact with the housing—thus electrically connected—such that when testing the circuit on the circuit board, or when installing it in a lighting system, a corresponding electrical and mechanical connection is also ensured.

In a preferred design, the through hole is an elongated hole when viewed from above the circuit board, wherein the longitudinal sides of the elongated hole run at an angle beneath the retaining bracket that is greater than 0°, preferably greater than 10°, more preferably greater than 30°.

When viewed from above the circuit board, the through hole meets the retaining bracket at an angle of greater than 0°. By increasing the angle between the longitudinal side and the retaining bracket the retaining force is increased, because the retaining element is then oriented more transverse than longitudinally to the retaining bracket, and the distance between the retaining element and the retaining bracket is reduced.

An elongated hole is a longitudinal through hole in this case. Its narrower transverse sides preferably form semicircles, the diameters of which correspond to the width of the elongated hole. The longitudinal sides of the elongated hole preferably run parallel to one another. By using an elongated hole as the through hole, it is ensured that a larger retaining element is used, as a result of which, larger housings can be used, or a stronger retaining force can be obtained.

If a retaining element of the housing is then used that has, e.g. two retaining axes and a slit running through the middle, the retaining element can then be placed in the elongated hole such that it is held in place along each retaining axis by the retaining bracket and the tapering.

In a preferred design, the through hole is an elongated hole viewed from above the circuit board, wherein at least two taperings are disposed on opposing longitudinal sides of the through hole. In this manner, the housing is retained more effectively in the through hole, because two opposing taperings and the retaining bracket then mechanically secure the housing in the circuit board's through hole. The taperings are disposed close to the semicircles of the elongated hole, for example.

In a preferred design, the at least one tapering has a trapezoidal shape, wherein a tapering surface of the tapering runs parallel to a longitudinal side of the through hole. A trapezoidal shape of the tapering can be easily produced, and also makes it possible to obtain a large overlapping region between the through hole and the retaining element. As a result, a larger surface of the retaining element of the housing is in physical contact with the through hole, resulting in an increased mechanical securing. As a result, the housing is disposed in an improved manner on the circuit board.

In another preferred design, the retaining bracket is attached to the circuit board by means of a soldered connection. As a result, the retaining bracket can be mechanically connected to the circuit board in a simplified production process. As a result, the retaining bracket is attached to the circuit board in a manner similar to that of all of the circuit elements of the circuit populating the circuit board, such that no additional production processes are needed for connecting the retaining bracket to the circuit board. The retaining bracket can be an uninsulated wire, e.g. made of copper, nickel, or iron. The retaining bracket can be galvanized, e.g. with tin, silver, or noble metals. The retaining bracket can be bowed.

In a preferred design, circuit elements of a circuit for operating a lamp are disposed on a lower surface of the circuit board lying opposite the upper surface. The housing protects the circuit underneath the housing in this manner, wherein the housing is inserted into the circuit board, and is secured in the through hole.

In an alternative design, circuit elements of a circuit for operating a lamp are disposed on the upper surface of the circuit board. As a result, it is not necessary to populate the circuit board on both sides in order to produce both a mechanical retaining connection and a reliable electrical connection between the housing and the circuit board. By clamping the retaining element in place by means of the tapering and the retaining bracket, it is possible to populate the circuit board on just one side. Moreover, the retaining bracket thus does not protruded above the upper surface of the circuit board. Because the retaining element is then disposed on the same side as the circuit elements, and the height of the retaining bracket is lower than the heights of the circuit elements, this results in a miniaturization of the circuit.

In a preferred design, the retaining bracket is disposed in the interior of the circuit board, thus between the upper surface of the circuit board and the opposing lower surface. As a result, the retaining bracket is integrated in the circuit board, and thus does not rise above the upper surface or extend below the lower surface of the circuit board. As a result, the circuit board can be miniaturized.

In a preferred design, the through hole is tapered by the tapering by at least 10%, preferably 15%, more preferably 20%. Different degrees of tightening are enabled by these different taperings. A larger tapering results in greater retaining forces in the retaining connection between the housing and the circuit board.

According to a further aspect of the invention, a system for a circuit for operating at least one lamp is proposed, composed of a circuit board according to the type described above, and a housing. The housing protects the circuit board from external effects, such as moisture, dirt, etc. and shields the circuit disposed on the circuit board from electromagnetic radiation.

The housing can also assume the function of a cooling element. It would also be possible to provide a plastic coating beneath the housing, in order to electrically insulate the housing from the environment of the system.

According to a preferred design, the housing has at least one retaining element, which is placed in the through hole in order to mechanically secure the housing on the circuit board by means of the retaining bracket and the tapering. By way of example, with a rectangular circuit board there are four additional holes in the corners or the edges of the circuit board, in which four positioning elements of the housing can be placed according to the invention, in order to produce the mechanical, and potentially electrical, connection between the housing and the circuit board. An additional one or two through holes are also provided in the circuit board in which one or two retaining elements of the housing can be placed according to the invention, in order to produce the mechanical, and potentially electrical, connection between the housing and the circuit board.

The retaining element preferably extends upward from the housing. This extension is understood in the following to be a retaining element that can be produced by means of a production process. By way of example, portions of the housing are stamped out thereby, and the inner region of the stamping is bent over appropriately. This results in a retaining element that is made of the same material as the housing and obtained through a simple material processing.

The retaining element preferably has at least two retaining flaps, wherein the retaining flaps are preferably identical. There is a slot located centrally between the flaps, produced for example in a stamping or cutting process. When such a retaining element of the housing is then secured in the through hole, the retaining flaps are separated by the retaining bracket. This results in a securing, wherein each retaining flap is tightened around the retaining bracket by means of a tapering in the through hole.

The retaining element is preferably mechanically secured with the retaining flap to the retaining bracket and a first tapering. In addition, the second retaining flap is mechanically secured by means of the retaining bracket and a second tapering. As a result, the retaining element is tightened in place, wherein the retaining bracket runs through a slot between retaining flaps. The tapering is then provided such that in each case, one side of the retaining flap is in direct physical contact with the interior of the through hole. As a result, the retaining element has no freedom of movement in the through hole after placing the housing on the circuit board, and is tightened in place. As a result, the retaining flaps of the retaining element cannot be bent apart beyond a certain extent when attaching the housing to the circuit board, such that the mechanical retention, as well as the electrical connection, are not released when a physical force is applied to the circuit board in relation to the housing.

In a preferred design, at least one flap of the retaining element is mechanically secured in the through hole by the tapering and the retaining bracket.

In a preferred design, the at least one retaining flap of the retaining element has a longitudinal side, wherein this longitudinal side of the retaining flap bears on at least 25% of the tapering. As a result, the retaining flap is in physical contact with the printed circuit board over most of the through hole, and in particular, is mechanically secured thereto by the retaining bracket and the tapering. A very stable retaining connection and a reliable grounding connection are obtained in this manner.

In a further aspect of the invention, a method for securing a housing to a circuit board is provided. The method comprises the following steps: placing the retaining bracket on an upper surface of the circuit board above a through hole, wherein the through hole has at least one tapering; placing a retaining element of the housing in the interior of the through hole, wherein the retaining element has at least two retaining flaps and one slot; and wherein the retaining bracket is inserted through the slot, such that the retaining element is mechanically secured by the retaining bracket and the tapering.

The invention, and further embodiments and advantages of the invention shall be described in greater detail below based on the figures, wherein the figures only describe exemplary embodiments of the invention. Identical components in the figures are provided with identical reference symbols. The figures are not to be regarded as drawn to scale, and some elements of the figures may be enlarged or simplified.

DETAILED DESCRIPTION

Figure 1:
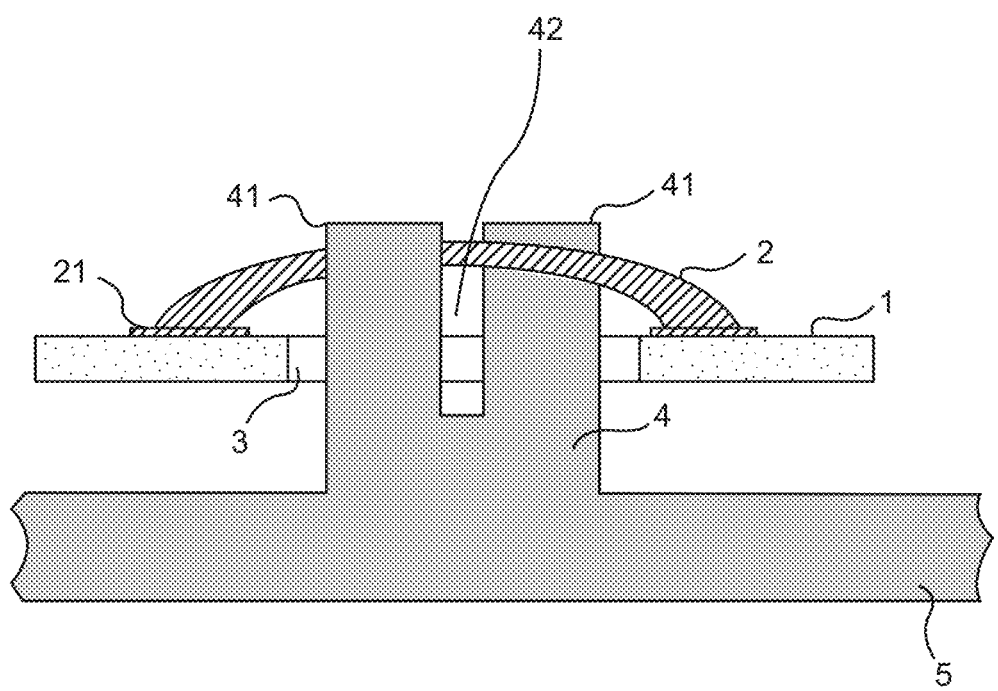
FIG. 1 shows a first exemplary embodiment of a system according to the invention.

FIG. 1 shows a first exemplary embodiment of a system according to the invention. A circuit board 1 is shown therein as a planar plate in a cross section. The circuit board 1 has a retaining bracket 2. The retaining bracket 2 is mechanically connected to the circuit board 1 at two soldering points 21 in the form of a bowed arch above the circuit board 1. The retaining bracket 2 is thus connected to the circuit board 1 such that it can be mechanically released therefrom and secured thereto. Instead of soldering points 21, welding points, screw connections, adhesive, or other mechanical securing means can be selected. The retaining bracket 2 can be an uninsulated wire, e.g. made of copper, nickel or iron. The retaining bracket 2 can be galvanized, e.g. with tin, silver or a noble metal.

The circuit board 1 also has a through hole 3, which is located at least partially underneath the retaining bracket 2. The through hole 3 extends from a first upper surface 11 of the circuit board 1 to a lower surface 12 of the circuit board 1. The through hole 3 is in the form of an elongated hole, in particular.

According to FIG. 1, a housing 5 is provided, which has at least one retaining element 4. This retaining element 4 extends upward. This extension is a part of the housing 5 obtained in a stamping and bending process. The retaining element 4 according to FIG. 1 has two identical retaining flaps 41, separated in the center by a slot 42. The slot 42 can be obtained through stamping or cutting.

In order to then mechanically secure the housing 5 to the circuit board 1, the retaining element 4 is inserted through the circuit board 1 from the lower surface 12. The retaining flaps 41 are then spread apart on the retaining bracket 2 located on the upper surface 11 of the circuit board 1, such that the slot 42 is temporarily widened when the housing is placed on the circuit board 1. The retaining bracket 2 is then in the region of the slot 42 in the retaining element 4 after the housing 5 has been placed thereon.

It is not shown in FIG. 1 that the through hole 3 has a tapering 31. The retaining element 4 is mechanically secured in the through hole 3 by means of this tapering 31 and the retaining bracket 2 such that the retaining flaps 41 bear on the tapering 31 and are thus in physical contact with the interior wall of the through hole 3. As a result, the retaining element 4 is held in place between the tapering 31 and the retaining bracket 2. The freedom of movement of the retaining element 4 in the through hole 3 is thus substantially reduced, or eliminated, such that the retaining connection cannot be easily released, in particular when a mechanical load is applied to the circuit board 1 in relation to the housing as a result of testing or when a circuit is put in operation on the circuit board 1 when installed in a lighting system, and also cannot be inadvertently impaired, in particular such that it becomes unstable, or loosened.

It is also provided that the retaining bracket 2 is electrically connected to a ground. As a result, the retaining bracket 2 also provides a grounding connection. A grounding connection is useful, for example, when an electrical connection must also be created by means of the connection between the housing 5 and the circuit board 1, if the housing 5 is made of a metallic material, for example. As a result, the housing 5 is grounded, and it is mechanically secured to the circuit board 1.

Figure 2A:
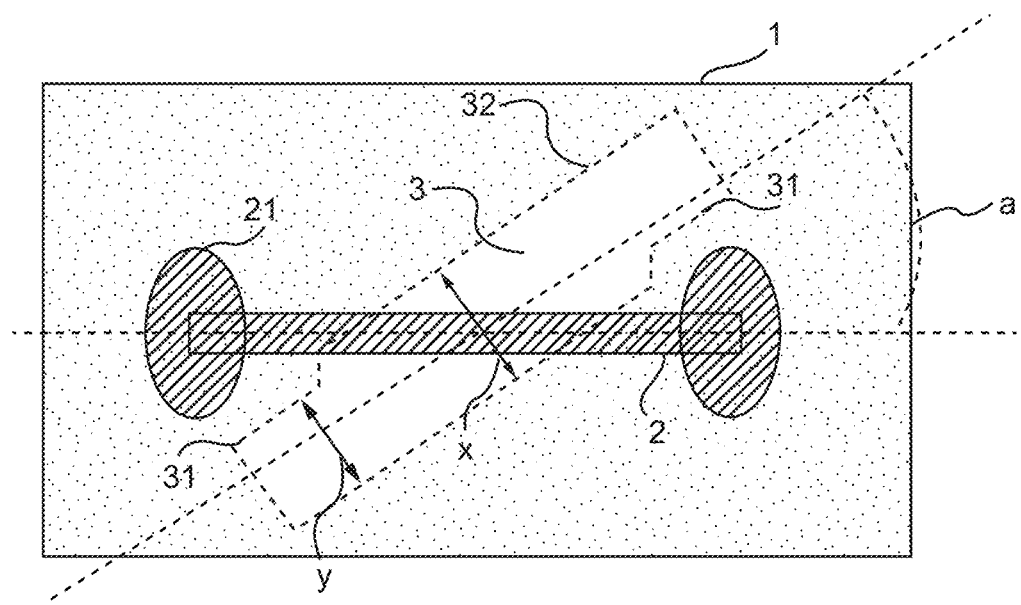
FIG. 2*a* shows a first exemplary embodiment of a circuit board according to the invention.

FIG. 2a shows a top view of an upper surface 11 of a first exemplary embodiment of a circuit board 1 according to the invention. This is shown in a view from above. It can be seen therein that the through hole 3 has the shape of an elongated hole—depicted stylistically herein as a rectangle. The transverse sides, which are orthogonal to the longitudinal sides 32, can take the form of semicircles, for example. The elongated hole 3 has two taperings 31 on opposing longitudinal sides 32. The longitudinal sides 32 of the through hole 3 are disposed at an angle α greater than 0° in relation to a longitudinal orientation of the retaining bracket 2. By altering the angle α, the retaining force of the mechanical securing can be adjusted.

The tapering 31 tapers the through hole 3. Thus, the transverse dimension x of the through hole 3 at the height of the retaining bracket 2 is greater than a transverse dimension y in the region of the tapering 31. The tapering 31 is in the form of a trapezoidal projection. The trapezoidal shape of the projection 31 enables a retaining element 4 to come in contact with the inner walls of the through hole 3 in a comparably large region of the longitudinal side 32 of the elongated hole 3. As a result, the mechanical securing of the housing 5 to the circuit board 1 is substantially improved.

Figure 2B:
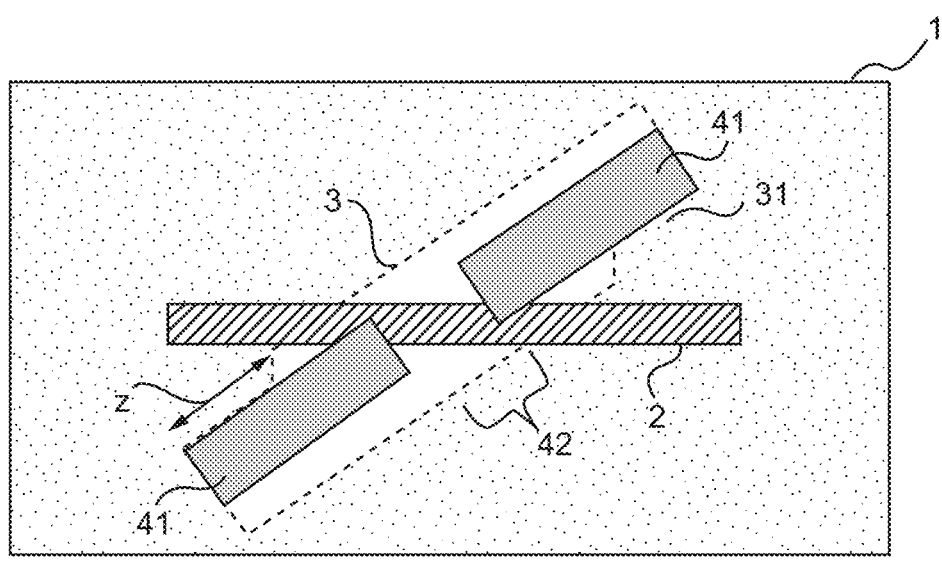
FIG. 2*b* shows a second exemplary embodiment of a system according to the invention.

A second exemplary embodiment of a system according to the invention is shown in FIG. 2b. The circuit board 1 illustrated in FIG. 2a is shown therein with a housing 5, and a retaining element 4 of the housing 5. The retaining element 4 is designed in accordance with FIG. 1, by way of example, and has two retaining flaps 41, 41', which are placed in the interior of the through hole 3. A retaining bracket 2 separates the retaining flaps 41, 41' in the region of the slot 42. Because the tapering surface z of the tapering 31 runs over a significant portion of the longitudinal side of a flap 41, the retaining element 4 is mechanically secured at both sides of the elongated hole 3, and in physical contact with the through hole. The retaining flaps 41, 41' are tightened by means of the tapering 31 and the retaining bracket 2. As a result, the retaining flaps 41 of the retaining element 4 cannot bend apart, because the freedom of movement of the retaining flaps 41 in the through hole 3 is substantially restricted, such that the housing 5 is not released even when the circuit board 1 is displaced in relation to the housing 5.

The retaining elements 4 of the housing 5 in the form of grounding projections are thus clamped more strongly than without projections 31, and permanently secure the housing 5 to the circuit board 1. As a result, a permanent reliable grounding connection is also obtained.

Figure 3A:
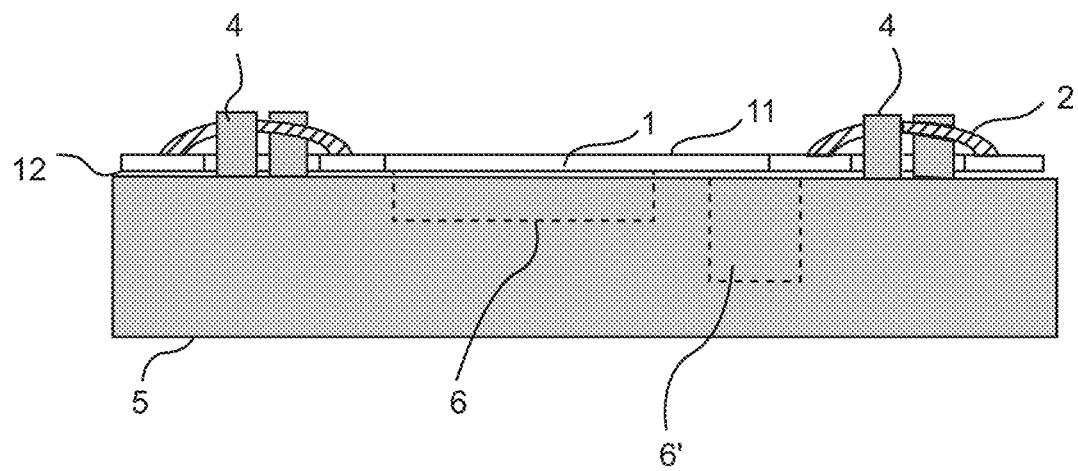
FIG. 3*a* shows a third exemplary embodiment of a system according to the invention.

A third exemplary embodiment of a system according to the invention is shown in FIG. 3a. There are at least two retaining brackets 2 disposed on the upper surface 11 of the circuit board 1 at the corners of the circuit board 1. The housing 5 has at least two retaining elements 4, which are mechanically secured to the retaining bracket 2 in accordance with FIG. 1 or FIG. 2b, respectively. FIG. 3 also shows that circuit elements 6, 6' are disposed on the lower surface 12 of the circuit board 1, which can form a circuit for operating a lamp. These circuit elements 6, 6' comprise a rectifier, a clocked converter, a transformer, a battery serving as a secondary voltage supply, and input and output interfaces, by way of example. In order to protect these circuit elements 6, 6' from external effects, it is provided that the housing 5 is mechanically secured to the circuit board 1. The housing 5 is made of aluminum, for example, and must be grounded. For this, the connection between the retaining element 4 and the retaining bracket 2 is also an electrical contact with a ground.

Figure 3B:
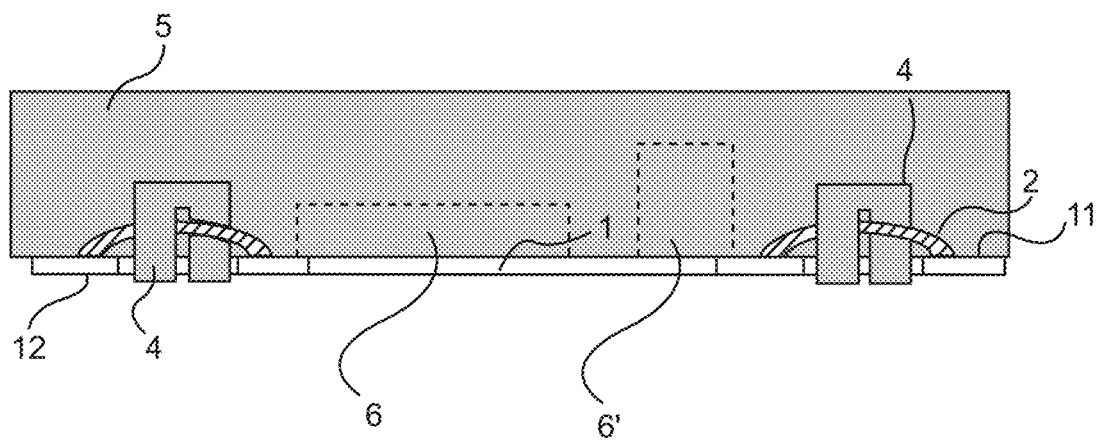
FIG. 3*b* shows a fourth exemplary embodiment of a system according to the invention.

A fourth exemplary embodiment of a system according to the invention is shown in FIG. 3b. In differing from FIG. 3a, it is provided that the retaining bracket 2 is formed on the same side as the circuit elements 6, 6'. According to FIG. 3b, this is the upper surface 11 of the circuit board 1. The mechanical securing by means of the retaining bracket 2 and the tapering 31 is not worse than that according to FIG. 3a, but it is no longer necessary to populate the circuit board 1 on both sides. This simplifies production, and reduces the structural height of the system, because the height of the retaining bracket 2 is lower than the height of the circuit elements 6, 6'.

Figure 4:
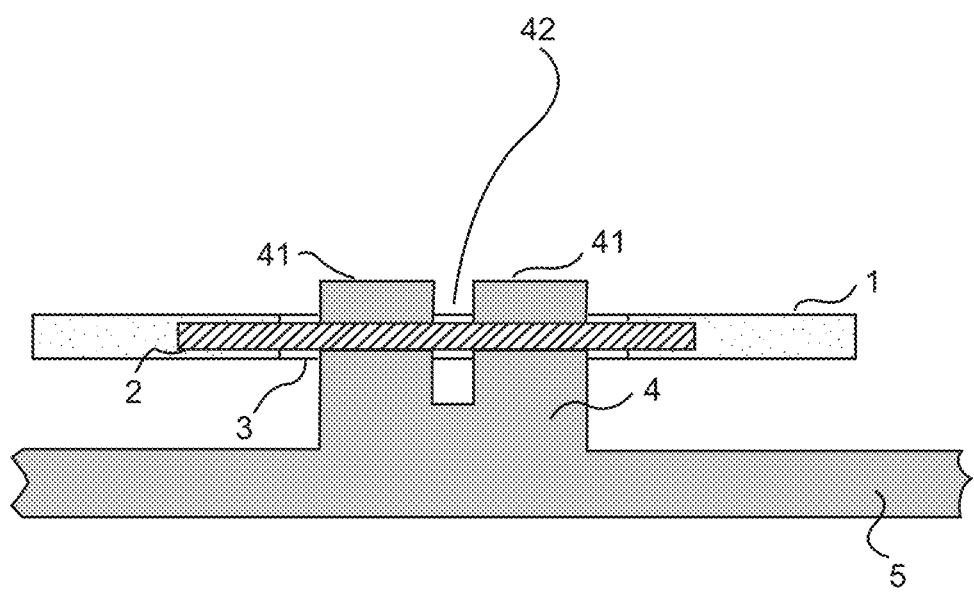
FIG. 4 shows a fifth exemplary embodiment of a system according to the invention.

A fifth exemplary embodiment of a system according to the invention is shown in FIG. 4. In differing from FIG. 1, the retaining bracket 2 is disposed within the interior of the circuit board 1, thus between the upper surface 11 and the lower surface 12. This reduces the structural height of the system and improves the mechanical stability of the connection of the retaining bracket 2 to the circuit board 1.

Figure 5:
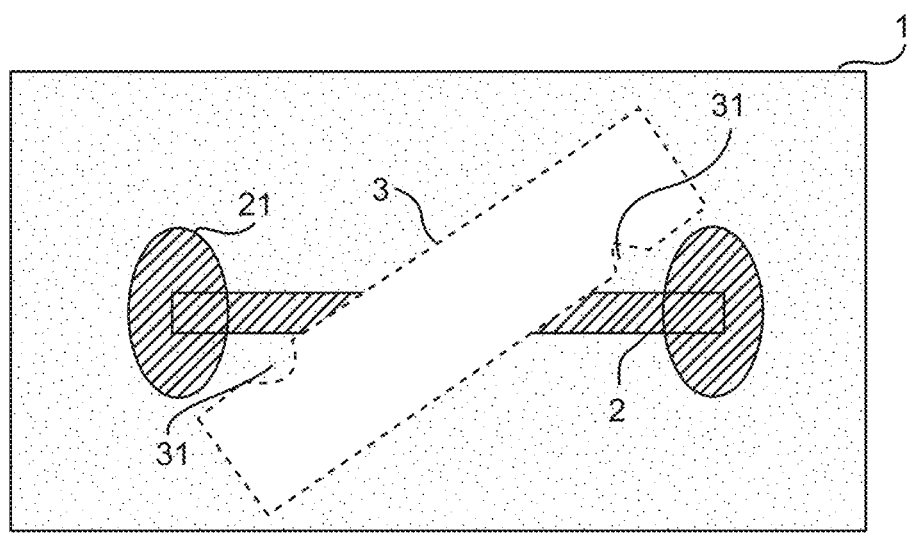
FIG. 5 shows a second exemplary embodiment of a circuit board according to the invention.

A second exemplary embodiment of a circuit board 1 is shown in FIG. 5 in a top view. In differing from FIG. 2a, the projections 31 have alternating shapes. In accordance with the left-hand projection 31', a semicircular bulge is created in the interior of the through hole 3. In comparison, the right-hand projection 31 has a triangular shape. The embodiment of a circuit board 1 shown in FIG. 5 shows that the tapering must only be formed such that it restricts or fully eliminates the movement radius of the retaining element 4, or the corresponding retaining flaps 41, 41' in the through hole.

All of the elements described and/or illustrated and/or claimed in the scope of the invention can be combined arbitrarily with one another.

LIST OF REFERENCE SYMBOLS 1 circuit board
  11 upper surface
  12 lower surface 2 retaining bracket, grounding conductor
   21 soldering point
3 through hole, elongated hole
   31 tapering, projection
   32 longitudinal side
4 retaining element
   41, 41' retaining flap
   42 slot
5 housing
6, 6' circuit elements
x transverse dimensions below the retaining bracket
y transverse dimensions in the region of the tapering
z tapering surface of the tapering
α angle between retaining bracket and through hole

What is claimed is:

1. A lamp driver system comprising:
a housing (5) having a retaining element (4) extending from the housing, said retaining element having at least two retaining flaps (41) and a slot (42) disposed between the retaining flaps;
a PCB board comprising
   a planar upper surface and a planar lower surface with an elongated through hole passing through the PCB board from the upper surface to the lower surface, the elongated through hole including two tapering elements each disposed on opposing longitudinal sides of the through hole;
   components of a lamp driver circuit mounted on the PCB board; and
   a retaining bracket (2) connected to the PCB board and passing over or through the through hole in the PCB board; wherein the longitudinal sides of the elongated through hole are orientation at an angle with respect to the retaining bracket;
wherein the PCB board is mechanically attached to the housing by inserting the retaining element on the housing through the through hole in the PCB board such that the respective retaining flaps are held by the retaining bracket and the respective tapering in the through hole on the PCB board.

2. The lamp driver system recited in claim 1 wherein the housing is capable of providing a grounded connection, and the retaining flaps on the housing are conductive, and further wherein the retaining bracket is conductive and is electrically connected to the PCB to provided a grounded connection when the PCB board is connected to the housing with the retaining bracket and the housing is connected to ground.

3. The lamp driver system recited in claim 1 wherein said angle is greater than 10 degrees.

4. The lamp driver system recited in claim 1 wherein said angle is greater than 20 degrees.

5. The lamp driver system recited in claim 1 wherein each tapering (3) is trapezoidal; and side (z) of the tapering (31) runs parallel to a longitudinal side (32) of the through hole (3) which is not tapered.

6. The lamp driver system recited in claim 1 wherein the components of a lamp driver circuit and the retaining bracket are mounted on the same planar surface of the PCB board.

7. The lamp driver system recited in claim 1 wherein the components of a lamp driver circuit and the retaining bracket are mounted on opposite planar surfaces of the PCB board.

8. The lamp driver system recited in claim 1 wherein the retaining bracket is soldered to the PCB board.

9. The lamp driver system recited in claim 1 wherein the retaining element is bowed and extends over the through hole in the PCB board.

10. The lamp driver system recited in claim 1 wherein the PCB board is rectangular and includes positioning holes near the corners of the PCB board, and the housing includes corresponding positioning elements.

11. The lamp driver system recited in claim 1 wherein the housing and the retaining flaps are integral components made from stamped metal.

12. The lamp driver system recited in claim 1 wherein the components of the lamp driver circuit mounted on the PCB board comprise at least one of the following: a rectifier, a clocked converter, a transformer, a battery, and input and output interfaces.

13. The lamp driver system recited in claim 1 wherein the taperings each comprise a projection from the respective longitudinal side of the through hole in the PCB board.

\* \* \* \* \*